US008072361B2

(12) United States Patent
Henzler

(10) Patent No.: US 8,072,361 B2
(45) Date of Patent: Dec. 6, 2011

(54) TIME-TO-DIGITAL CONVERTER WITH BUILT-IN SELF TEST

(75) Inventor: Stephan Henzler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 12/684,771

(22) Filed: Jan. 8, 2010

(65) Prior Publication Data

US 2011/0169673 A1 Jul. 14, 2011

(51) Int. Cl.
*H03M 1/10* (2006.01)

(52) U.S. Cl. .................................. 341/120; 341/166

(58) Field of Classification Search .................. 341/166; 702/79, 89, 180; 324/76.54, 76.55
See application file for complete search history.

(56) References Cited

U.S. PATENT DOCUMENTS

| 6,754,613 | B2 | 6/2004 | Tabatabaei et al. | |
|---|---|---|---|---|
| 2003/0006750 | A1* | 1/2003 | Roberts et al. | 324/76.53 |
| 2003/0098731 | A1* | 5/2003 | Tabatabaei et al. | 327/160 |
| 2003/0210028 | A1* | 11/2003 | Beach et al. | 324/76.16 |
| 2009/0273384 | A1* | 11/2009 | Kojima et al. | 327/262 |

OTHER PUBLICATIONS

Chan, A. H. et al., A Jitter Characterization System Using a Component-Invariant Vernier Delay Line, IEEE Transactions on Very Large Scale Integration (VLSI) Systems, vol. 12, No. 1, Jan. 2004, pp. 79-95.*

Chao, A. S. et al., A Jitter Characterizing BIST with Pulse-Amplifying Technique, 2009 Asian Test Symposium, Nov. 23-26, 2009, pp. 379-384, IEEE, ISSN : 1081-7735, Print ISBN: 978-0-7695-3864-8, INSPEC Accession No. 11052876, Digital Object Identifier : 10.1109/ATS.2009.23.*

Henzler et al., A Local Passive Time Interpolation Concept for Variation-Tolerant High-Resolution Time-to-Digital Conversion, IEEE Journal of Solid-State Circuits, vol. 43, No. 7, Jul. 2008, pp. 1666-1676.*

Henzler et al., 90nm 4.7ps-Resolution 0.7-LSB Single-Shot Precision and 19pJ-per-Shot Local Passive Interpolation Time-to-Digital Converter with On-Chip Characterization, Digest of Technical Papers 2008 IEEE International Solid-State Circuits Conference, Feb. 3-7, 2008, p. 548+.*

Liu W. et al., A Test Strategy for Time-to-Digital Converters Using Dynamic Element Matching and Dithering, 2005 IEEE International Symposium on Circuits and Systems, May 23-25, 2005, p. 3809.*

Nelson, B. et al., On-Chip Calibration Technique for Delay Line Based BIST Jitter Measurement, 2004 IEEE International Symposium on Circuits and Systems, vol. I pp. 944-947, May 23-26, 2004.*

Nedovic, et al., "A Test Circuit for Measurement of Clocked Storage Element Characteristics," IEEE Journal of Solid-State Circuits, vol. 39, No. 8, Aug. 2004, pp. 1294-1304.

* cited by examiner

*Primary Examiner* — Howard Williams
(74) *Attorney, Agent, or Firm* — Lee & Hayes, PLLC

(57) ABSTRACT

Apparatuses and methods related to time-to-digital converters (TDCs) are herein described. Generally, a time-to-digital converter is a device which measures a time period or time interval and outputs a digital value representing the measured time period. In an implementation, an apparatus is provided comprising a time-to-digital converter circuit, which further comprises a built-in self test (BIST). The built-in self test may be implemented using one or more oscillators coupled to the time-to-digital converter via one or more multiplexer devices.

25 Claims, 4 Drawing Sheets

US 8,072,361 B2

TIME-TO-DIGITAL CONVERTER WITH BUILT-IN SELF TEST

BACKGROUND

The present application relates to time-to-digital converters with built in self-test (BIST), corresponding to methods and apparatuses comprising such time-to-digital converters.

Time-to-digital converters (TDCs) are devices which measure a length of a time period and output the length of the time period as a digital value. Time-to-digital converters may, for example, be employed in a phase-locked loop. For instance, a time-to-digital converter may be employed to measure a time difference between edges, such as rising edges, of a reference signal or a feedback signal in a phase-locked loop. However, time-to-digital converters are not limited to such applications. Other example applications for time-to-digital converters include TDC-based analog-to-digital converters, and the like.

In some implementations, a time-to-digital converter may comprise an asynchronously timed core and a digital periphery. Such a core may be somewhat difficult to test during production, because of characteristics which may be desired for test signals to be input to the time-to-digital converter. For example, time-to-digital converters often have an inherently asynchronous internal structure. Time-to-digital converters may generally comprise at least one delay line including multiple delay elements which may, for example, be configured in a loop. A start signal to start the time-to-digital converter making a time measurement may propagate along the delay line in a self-controlled way, wherein the propagation velocity may depend on the combined delay of the delay elements of the delay line. Therefore, it may not be possible to force the delay line, and therefore, force the inputs to comparators of the time-to-digital converter that are coupled to the delay line, into a static state, which is generally used for testing logic circuits.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
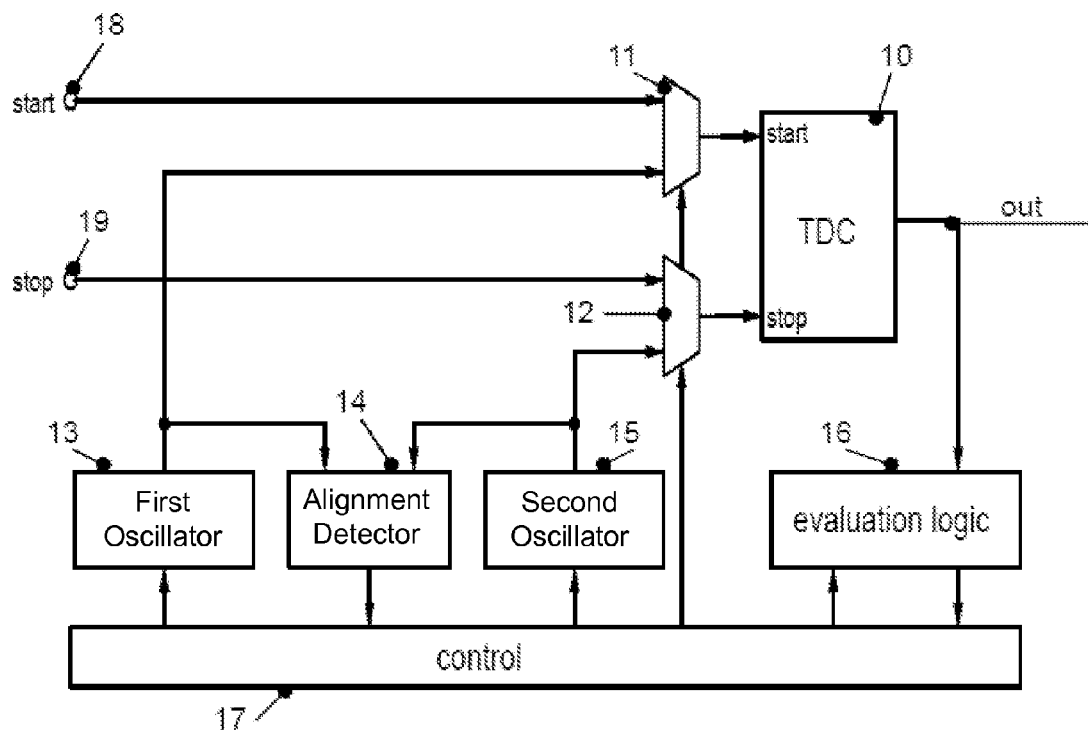
FIG. 1 shows a block diagram of a time-to-digital converter apparatus according to an embodiment.

Embodiments of apparatuses and methods related to time-to-digital converters (TDCs) are herein described. Generally, a time-to-digital converter is a device which measures a time period or time interval. The measured time interval may be described as a time difference between two events. The two events, for example, may be specific edges of signals fed to the time-to-digital converter. A time-to-digital converter generally outputs a digital value representing the measured time period. The terms time period and time interval are used interchangeably throughout the disclosure.

In the following descriptions of embodiments, any direct connection or coupling between functional blocks, devices, components, circuit elements or other physical or functional units shown in the drawings described herein could also be implemented by an indirect connection or coupling, i.e., a connection or coupling comprising one or more intervening elements. Furthermore, functional blocks or units shown in the drawings may be implemented as separate circuits in some embodiments, but may also be fully or partially implemented in common circuits or common devices in other embodiments. In other words, the functional blocks are provided to give a clear understanding of various functions performed in a described embodiment, and are not to be construed as necessarily indicating separate physical entities.

The drawings are provided to give an illustration of some aspects of embodiments of the present disclosure and are therefore to be regarded as schematic only. In particular, the elements shown in the drawings are not necessarily to scale with each other, and the placement of various elements in the drawings is generally chosen to provide a clear understanding of the respective embodiment. The placement of various elements in the drawings is not to be construed as necessarily being a representation of the actual relative location of the various components and implementations according to embodiments of the present disclosure unless noted to the contrary.

The features of the various embodiments described herein may be combined with each other unless specifically noted to the contrary. On the other hand, describing an embodiment with a plurality of features is not to be construed as indicating that all those features are necessary for practicing the present disclosure, as other embodiments may comprise less features and/or alternative features.

Example TDC Implementation

A time-to-digital converter may, for example, comprise a first input, also referred to as a start input, and a second input, also referred to as a stop input. A signal fed to the start input starts the time-to-digital converter measuring a time period, and a signal fed to the stop input stops the time-to-digital converter measuring the time period. For example, rising edges, falling edges, or both edges of input signals may be used for starting and/or stopping the time-to-digital converter measuring a time period. In one example, digital signals are used to start and/or stop the time-to-digital converter measuring a time period.

Time-to-digital converters may, for example, be used as phase detectors in phase-locked loops. For instance, if one digital signal is fed to the start input and another digital signal is fed to the stop input of an example time-to-digital converter, and rising edges of the digital signals trigger the start or the stop of measuring a time period, then the time-to-digital converter may measure a time difference between rising edges of the two signals, which may be representative of a phase difference between the two signals. However, time-to-digital converters are not limited to applications in phase-locked loops. Further, time-to-digital converters can be used for measuring small time differences, for example, measuring time differences in the pico-second range.

In FIG. 1, a time-to-digital converter apparatus according to an embodiment of the present disclosure is shown. The time-to-digital converter apparatus of FIG. 1 comprises a start input 18 and a stop input 19, which operate as described above, i.e., they are used to start and stop the measurement of a time period to be measured and to be converted to a digital value. In the example embodiment shown, the start input 18 is coupled to a start input of a time-to-digital converter 10 via a first multiplexer 11. The stop input 19 is coupled to a stop input of time-to-digital converter 10 via a second multiplexer 12.

The time-to-digital converter 10 may output a digital output signal, which is representative of the time period measured.

The apparatus of FIG. 1 further comprises a built-in self test (BIST) for the time-to-digital converter 10. The built-in self test of FIG. 1 comprises a first oscillator 13 and a second oscillator 15. An output of first oscillator 13 is coupled with an input of first multiplexer 11, and an output of second oscillator 15 is coupled with an input of second multiplexer 12.

A control portion 17 controls the first oscillator 13, the second oscillator 15 and the first and second multiplexers 11 and 12. The control portion 17 may be implemented, for example, as a state machine, or another other kind of control logic. In one example, the first oscillator 13, the second oscillator 15 and the first and second multiplexers 11 and 12, controlled by control 17, comprise a stimulation engine which provides various signals for testing the time-to-digital converter 10, as will be explained further below.

A multiplexer, in the context of this application, may be generally described as an entity which selectively couples one of a plurality, i.e., at least two, inputs with its output. For example, in the embodiment of FIG. 1, the first multiplexer 11 selectively couples either the start input 18 or the output of the first oscillator 13 to the start input of the time-to-digital converter 10. Accordingly, multiplexer 12 selectively couples either the stop input 19 or the output of the second oscillator 15 to the stop input of the time-to-digital converter 10.

In a first mode of operation, which also may be referred to as a "regular mode," the first and second multiplexers 11 and 12 are controlled by control 17 to couple the start input 18 and the stop input 19 to the start input and the stop input, respectively, of the time-to-digital converter 10. In a second mode of operation, which also may be referred to as a "self-test mode," the first and second multiplexers 11 and 12 are controlled by control 17 to couple the outputs of the first oscillator 13 and the second oscillator 15 to the start input and the stop input, respectively, of time-to-digital converter 10. The output of the time-to-digital converter 10 may then be captured, evaluated, and/or analyzed by an evaluation logic portion 16.

In the first mode of operation, the apparatus of FIG. 1 operates generally as a conventional time-to-digital converter. Therefore, this mode of operation will not be described in further detail.

Example Self-Test Mode

In the second mode of operation, the output signal of the time-to-digital converter 10 is fed to an evaluation logic portion 16. The evaluation logic portion 16 evaluates the output signal to detect a possible incorrect behavior of the time-to-digital converter 10. Examples of possible incorrect behavior will be explained below. While the evaluation logic portion 16 may communicate with the control 17, in one example, the evaluation logic portion 16 may be implemented separately or remotely from the control 17. In an alternate example, the evaluation logic portion 16 may be implemented in a common circuit with the control 17.

In one embodiment, the complete apparatus of FIG. 1 may be implemented as a single circuit, or part thereof. However, in an alternate embodiment, some parts of the apparatus of FIG. 1 may be implemented as separate circuits.

The second mode of operation will be described in more detail as follows.

In one example embodiment, the first oscillator 13 and the second oscillator 15 may output oscillating signals having approximately the same, but not exactly the same, frequency. The frequencies of the signals may differ by a predetermined degree. For example, the frequencies of the signals may differ by up to or about 5%, up to or about 10%, up to or about 20%, and the like. In other examples, the frequencies may differ by other values. By using signals with differing frequencies, the edges of the signals may "drift" with respect to each other, as shown with reference to FIG. 2.

Figure 2:
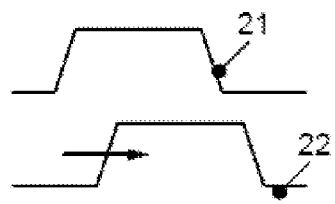
FIG. 2 shows examples for oscillator signals appearing in the apparatus of FIG. 1.

In FIG. 2, an example of a signal 21 output by a first oscillator 13 and an example of a signal 22 output by a second oscillator 15 are shown. The waveforms shown are examples, and other waveforms, for example, waveforms with steeper or less steep edges, may be possible. The amplitudes of the signals 21 and 22 need not be equal or approximately equal.

In one example, signal 21 may have a higher frequency than signal 22. Thus, the rising edges of the signals "move" from period to period with respect to each other as indicated by an arrow shown in FIG. 2. In this example, the next rising edge of signal 21 occurs relatively earlier than the next rising edge of signal 22, leading to the movement or drift.

In an example, signal 21 may be fed to the start input of the time-to-digital converter 10 and signal 22 may be fed to the stop input of time-to-digital converter 10. Further, the start and stop of the time interval to be converted to a digital value may be triggered by the rising edges of signals 21 and 22. In this example, this means that the time interval may change from period to period based on the relative frequencies (and thus periods) of signals 21 and 22. After an interval of time corresponding to the smallest common integer multiple of the periods, i.e., the inverse frequencies, of the two signals, the same relationship may occur again, or, in other words, the various time differences generated may show an essentially periodic behavior.

In an alternate embodiment, a smallest common integer multiple of the periods of the two signals may not exist, thus, no essentially periodic behavior may occur.

In an example embodiment, the frequencies of the output signals of the first oscillator 13 and the second oscillator 15 are selected such that, in case the evaluation logic portion 16 does not detect an incorrect behavior of the time-to-digital converter 10, all possible output values of the time-to-digital converter 10 are generated by stimulation through the oscillator signals. In an alternate embodiment, a difference between the period of an output signal of the first oscillator 13 and an output signal of the second oscillator 15 is not an integer multiple of the resolution of the time-to-digital converter 10.

In embodiments of the present disclosure, output signals of the time-to-digital converter 10 for a plurality of different input time intervals, are evaluated, for example, by evaluating a histogram.

In one embodiment, an alignment detector 14 is optionally coupled to the outputs of the first oscillator 13 and the second oscillator 15, as shown in FIG. 1. The alignment detector 14 may be provided to improve or ensure a defined start of a measurement by the time-to-digital converter 10. For example, the alignment detector 14 may detect when relevant edges, such as the rising edges, of the output signals of the first oscillator 13 and the second oscillator 15 are aligned.

That is, the alignment detector 14 may determine when the relevant edges of the output signals coincide, or occur at the same time, possibly within a predetermined accuracy. In other words, the alignment detector 14 may detect when a phase difference between the output signals is at or near zero.

In other embodiments, the alignment detector 14 may additionally or alternatively detect other predetermined phase differences. In an example embodiment, the time-to-digital converter 10 may begin a measurement when a desired alignment is detected by the alignment detector 14. In other embodiments, measurements designed for testing the time-to-digital converter 10 may be started at any suitable time. The time between two such alignments is also referred to as a cycle in the following discussion.

In an example embodiment, the frequencies of the two oscillators 13 and 15 may be selected as follows: Let $T_{max}$ be equal to the maximum time period which is to be applied to the time-to-digital converter 10. Then, the frequency $f_1$ of first oscillator 13 may be set to $f_1=1/T_{max}$. In other words, a period $T_1$ of the signal generated by first oscillator 13 is set to $T_1=T_{max}$. Also, let N be equal to the number of different time periods to be applied to the time-to-digital converter 10 in a cycle. Then, a frequency $f_2$ of the second oscillator 15 may be set to $f_2=(N/(N+1))*f_1$. Thus, a period $T_2$ of the signal generated by second oscillator 15 equals $T_2=1/f_2$.

In an embodiment, the resolution of the time-to-digital converter 10 may be described as the Least Significant Bit (TLSB) of its digital output. Thus, TLSB corresponds to the time period indicated by a least significant bit of the digital output signal of time-to-digital converter 10. Accordingly, the number of different time periods to be applied to the time-to-digital converter 10, N, may be set to $N=T_{max}/TLSB$. In such an embodiment, each quantization step of the time-to-digital converter 10 may be measured once in each cycle. However, smaller or larger values of N are equally possible. In an example embodiment, a difference $\Delta T=abs(T_2-T_1)$, where "abs" indicates the absolute value of the difference, is selected such that it is not an integer multiple of TLSB.

In an example embodiment of the present disclosure, the first and second oscillators 13 and 15 may be free running oscillators. In other words, the oscillators may be generally turned on permanently. In another embodiment, the oscillators may be turned on when switching to the second mode of operation (self-test mode), without the need for triggering the oscillators 13 and 15 by a specific event.

Figure 3:
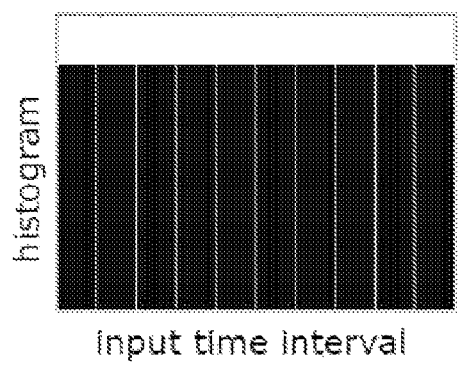
FIG. 3 shows a histogram of input time intervals, for explaining some features of some embodiments.

Using two oscillators with approximately, but not exactly, the same frequency may cause the time interval input to the time-to-digital converter 10 to change slowly. Moreover, in one embodiment, the time intervals may be distributed evenly between zero and a maximum time interval. The maximum time interval may be approximately determined by the period length of the output signals of oscillator 13 and 15 of the embodiment of FIG. 1, as explained above. This situation is schematically shown in FIG. 3, which shows an example of a histogram of the input time intervals. As can be seen in FIG. 3, all possible time intervals may occur with the same frequency of occurrence.

The optional alignment detector 14 of FIG. 1 may also be used in controlling how many times each input time interval is to be fed to the time-to-digital converter 10. As between two alignments of the output signal of the first oscillator 13 and the second oscillator 15, each possible input time interval may occur once. For performing an example self test, each input time interval may be applied to the time-to-digital converter 10 a single time, but in other embodiments each input time interval may be applied a plurality of times.

For example, when time intervals with a distribution as shown in FIG. 3, that is, evenly distributed time intervals, are fed to the time-to-digital converter 10, and when the time-to-digital converter 10 operates without errors, the digital values of the output signal of the time-to-digital converter 10 should also be essentially evenly distributed. A deviation from an essentially even distribution may indicate an error or a fault in the time-to-digital converter 10, which may then be detected by the evaluation logic portion 16.

Figure 4:
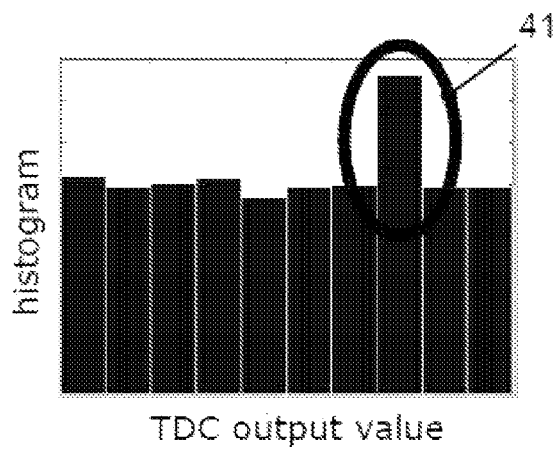
FIG. 4 shows a histogram of TDC output values, for explaining some features of some embodiments.

Accordingly, the evaluation logic portion 16 may generate a histogram of the output values of the time-to-digital converter 10. An example of such a histogram is shown in FIG. 4. Such a histogram can be acquired by the evaluation logic portion 16 in different ways. For example, all "bins," i.e., all values of the histogram, may be acquired in parallel, that is, essentially simultaneously. Such an approach is comparatively fast, but requires the evaluation logic portion 16 to be capable of acquiring all bins in parallel. In another approach, the bins may be acquired one after the other. This approach places less stringent requirements on the evaluation logic portion 16, but is somewhat slower. Other variants may comprise the parallel acquisition of some of the bins, i.e., a mixture of parallel acquisition and serial acquisition.

In the example shown in FIG. 4, as indicated by a circle 41, one output value of the time-to-digital converter 10 occurs relatively more often than other output values. Therefore, in such a case, the evaluation logic portion 16 may detect that the time-to-digital converter 10 does not operate correctly, and give an error indication. An indication of error from the evaluation logic portion 16 may also indicate the particular output value of the time-to-digital converter 10 that occurred relatively more often than others. Additionally, an error may be detected by the evaluation logic portion 16 if one or more values occur relatively less often than the remaining values, or one or more expected output values do not occur at all. For example, output values that occur relatively more often or relatively less often than the average may, for example, indicate a non-linearity of the time-to-digital converter 10.

However, not all such errors may indicate the time-to-digital converter 10. Similar occurrences, which may be referred to as "soft errors," may be related to crosstalk, design variations, or even design inaccuracies. Further, if some output values are missing, this may indicate a hard failure in the circuit.

Example Method

Figure 5:
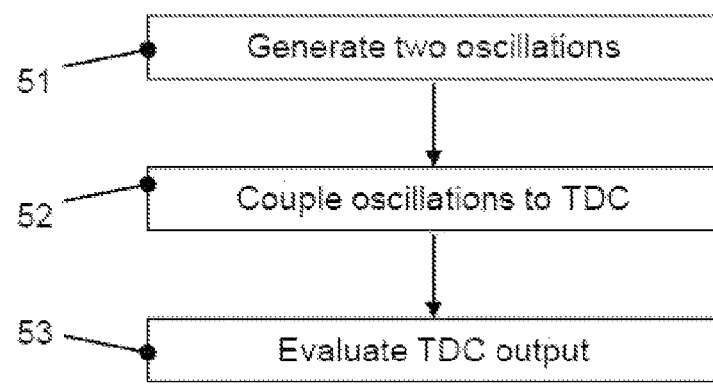
FIG. 5 shows a block diagram of an example method according to an embodiment.

In FIG. 5, a method for testing a time-to-digital converter circuit according to an embodiment is shown. This method may be implemented, for example, in the apparatus of FIG. 1, but is not limited thereto. The order in which the method is described is not intended to be construed as a limitation, and any number of the described method blocks can be combined in any order to implement the method, or an alternate method. Furthermore, the method can be implemented in any suitable hardware, software, firmware, or a combination thereof.

At 51, two oscillations are generated. The two oscillations may be generated as described above. In example embodiments, these oscillations may be free running oscillations with slightly different frequencies, as described above.

At 52, each of the two oscillations is coupled to a time-to-digital converter. For example, one oscillation may be coupled to a start input and the other oscillation may be coupled to a stop input of the time-to-digital converter. The two oscillations may be coupled to the time-to-digital converter such that due to the difference in frequency between the two oscillations, continually different time periods may be fed to the time-to-digital converter for conversion to digital values.

At 53, the output of the time-to-digital converter is evaluated. The output may be evaluated, for example, by analyzing a histogram of the output values to detect output values occurring relatively more often or relatively less often than other output values.

The above-described embodiments serve merely as examples, and the present disclosure is not limited to these embodiments. Some possible variations will be explained below.

With reference to FIG. 2, it has been previously explained that rising edges may trigger the start or stop of measuring a time interval by the time-to-digital converter 10. In other embodiments, falling edges or rising and falling edges may be used to trigger the start or stop of measuring a time interval by the time-to-digital converter 10.

With reference to the above-described embodiments, one or more full cycles may be used for making measurements, i.e., all time intervals may be fed to the time-to-digital converter 10. In other embodiments, a part of a cycle may be used for making measurements, i.e., only some values may be fed to the time-to-digital converter 10.

Furthermore, in an embodiment, the alignment detector 14 may generally monitor the edges of the output signal of the first oscillator 13 and/or the second oscillator 15. In this way, the time interval currently fed to the time-to-digital converter 10 may be measured. In other words, the output values from the time-to-digital converter 10, which are evaluated by evaluation logic 16, may be correlated with the corresponding input values.

For example, a period from one alignment detection to the next alignment detection, as detected by alignment detector 14, may have N different time intervals corresponding to N rising edges from the first oscillator 13 or the second oscillator 15. In an alternate example, the N time intervals may correspond to falling edges, or both rising and falling edges, in case both are used. The $k^{th}$ time interval, after the last alignment having been detected, may have a length $T_{max}/N*k$, where $T_{max}$ is the duration of the longest time interval which essentially may correspond to the period of the signal output by the first oscillator 13. In an example embodiment, the alignment detector 14 or the control 17 may comprise a counter to count the rising edges (or other relevant edges) of at least one of the oscillators 13 or 15 to determine k.

In some embodiments, the first oscillator 13 and the second oscillator 15 of FIG. 1 have fixed output frequencies. In other embodiments, at least one of the oscillators 13 and/or 15 may be tunable. In one embodiment, the control 17 may be configurable to adjust a desired frequency mismatch between the two oscillators. An example implementation of such an adjustable oscillator is schematically shown in FIG. 6.

Example Alternate Embodiments

Figure 6:
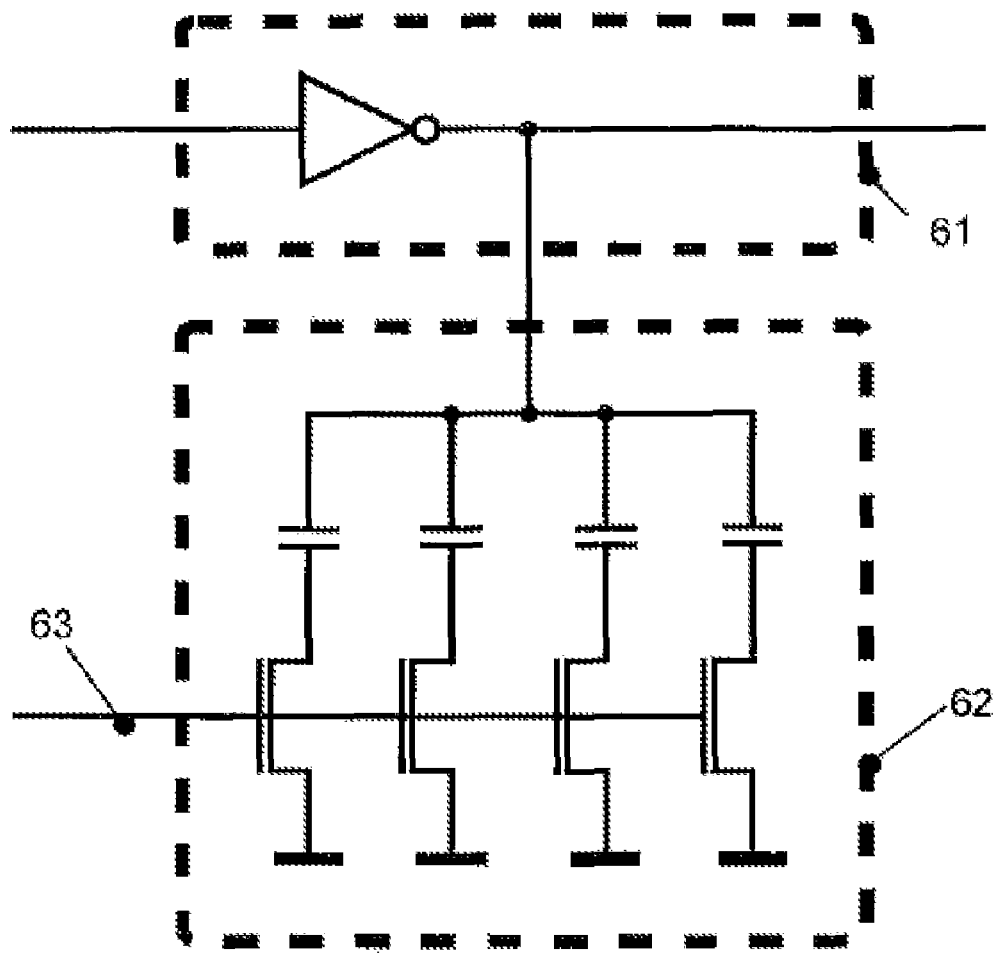
FIG. 6 shows a circuit diagram of a portion of an oscillator according to an embodiment.

In the embodiment illustrated in FIG. 6, an oscillator is implemented as a ring oscillator, of which one inverter 61 is shown. In example embodiments, a plurality of inverters 61 may be used in the oscillator circuit of FIG. 6. In one embodiment, the oscillator of FIG. 6 may be implemented as the first oscillator 13 and/or the second oscillator 15 of FIG. 1. In an alternate embodiment, the oscillators 13 and 15 may be implemented as a different type of oscillator.

Coupled to inverter 61 is a variable load 62, which in the embodiment of FIG. 6, comprises four capacitances and four Metal Oxide Semiconductor (MOS) transistors, coupled between the capacitances and ground. By controlling the MOS transistors via a control input 63, the effective load of inverter 61, and therefore, the frequency of the ring oscillator, can be varied. The arrangement of FIG. 6 serves only as an example, and other methods of frequency regulation or variable loads may also be used. For example, varactors, and the like may be used at least in part as the variable load 62. Furthermore, the use of four capacitances and four MOS transistors in FIG. 6 is merely an example for illustration purposes. In alternate embodiments, the variable load 62 in the circuit illustrated in FIG. 6 may be implemented with more or less than four capacitances and four MOS transistors, and remain within the scope of the disclosure.

As previously mentioned, in one example, control 17 may be implemented as a state machine. The state machine may, for example, control multiplexers 11 and 12 to switch between a first mode of operation and second mode of operation. In another example, control 17 may perform periodic self testing of the time-to-digital converter 10. For instance, control 17 may perform the periodic self testing of the time-to-digital converter 10 during a post production test or during regular operation. In an embodiment, the control 17 may make a switch to the second mode of operation (self-test mode) when the alignment detector 14 outputs a signal indicating that the output signals of oscillators 13 and 15 are aligned. As discussed above, with the switch to the second mode of operation, the output signal of the time-to-digital converter 10 may be fed to the evaluation logic portion 16 for error detection. Here, k−1 more oscillation periods may be used for this evaluation, such that each possible time difference of the oscillator output signals may be fed at least once to time-to-digital converter 10.

In an embodiment, the control 17 may additionally measure the frequency of the first oscillator 13 and the second oscillator 15, for example, by comparing the output signals of the first oscillator 13 and the second oscillator 15 with a reference clock signal.

As has been described above with reference to FIGS. 3 and 4, the evaluation logic portion 16 may evaluate a histogram representing the output signals of the time-to-digital converter 10. For example, output values that occur relatively more often or relatively less often than the average may, for example, indicate a non-linearity of the time-to-digital converter 10. Further, if some output values are missing; this may indicate a failure in the circuit.

In an alternate embodiment, the evaluation logic portion 16 may evaluate only a part of the histogram, monitoring the occurrence of one or more of the time-to-digital converter 10 outputs. In another embodiment, a test may be performed comprising monitoring the histogram to determine if one or more of the output values occur, without evaluating the histogram to check if a value occurs more or less often than the average.

In other embodiments, a time-to-digital converter 10 output value may be determined following a predetermined number of oscillator periods, after the two oscillator output signals are aligned. For example, the k-th period after the two oscillator output signals are aligned may be measured. In another embodiment, a histogram is created, but measurements may be taken periodically. For instance, only each k-th period after the alignment has been detected may be measured. With such an embodiment, the histogram can be evaluated to determine whether a same output value occurs with a particular input value.

Some embodiments of this disclosure may implement more than one, or all of the above described testing methods, whereas, other embodiments may implement only a single method.

Figure 7:
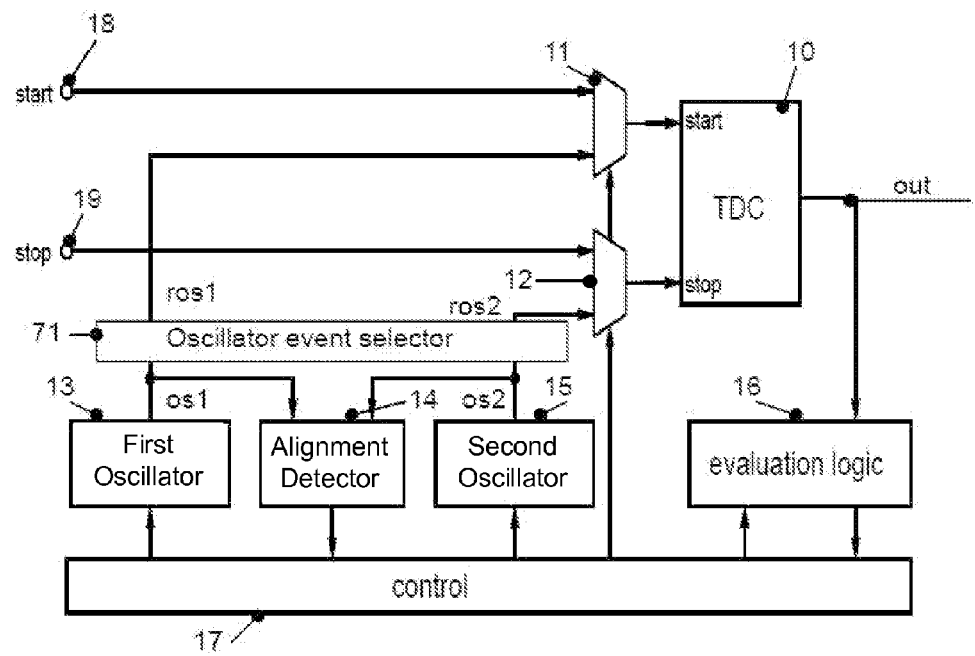
FIG. 7 shows a block diagram of a time-to-digital converter apparatus according to a further embodiment.

In the embodiment of FIG. 1, the signals of the first oscillator 13 and the second oscillator 15 may be fed to the time-to-digital converter 10 via multiplexers 11 and 12, essentially without modification. In another embodiment, which is schematically shown in FIG. 7, an oscillator event selector 71 is provided. The oscillator event selector 71 may be implemented as logic circuitry, for example, or the like. Apart from the provision of the oscillator event selector 71, the embodiment of FIG. 7 corresponds to the embodiment of FIG. 1 in description and general operation.

The operation of oscillator event selector 71 will be explained with reference to FIG. 8.

Figure 8:
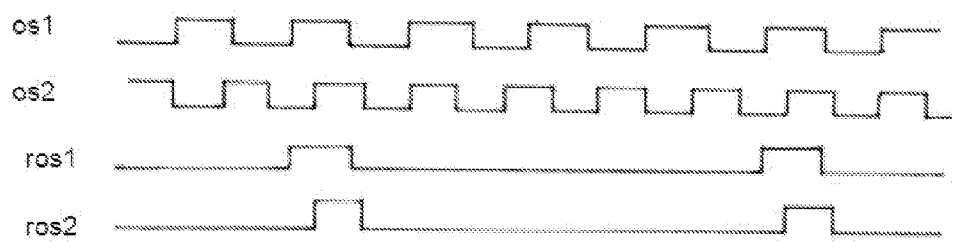
FIG. 8 shows examples of signals described with regard to the apparatus of FIG. 7.

Examples of oscillator output signals are illustrated in the first two rows of FIG. 8. First, a signal os1, which may be output by the first oscillator 13, is shown. Next, a signal os2, which may be output by the second oscillator 15, is shown. In an embodiment, the oscillator event selector 71 may be configured to modify signals os1 and os2, and then forward the modified signals to the first and second multiplexers 11 and 12. For example, the oscillator event selector 71 may be configured to modify signals os1 and os2 by periodically filtering a number of oscillation cycles of os1 and os2. In one embodiment, the oscillator event selector 71 may be configured to pass only one oscillation cycle out of L oscillation cycles, where L is a configurable or fixed integer number, to the first and second multiplexers 11 and 12. In FIGS. 7 and 8, example modified signals are shown as ros1 and ros2. Examples of signals ros1 and ros2 for L=5 are shown in FIG. 8.

The use of the oscillator event selector 71 to modify signals os1 and os2, as shown in FIG. 8, may increase the time duration between two time periods applied to the time-to-digital converter 10. Increased time duration between time periods may have the effect of reducing the computing power requirements for the evaluation logic portion 16, as fewer events may be evaluated. On the other hand, it may take longer to acquire the same number of data events to be evaluated, for example, for a histogram.

As can be seen from the above explanations, a plurality of embodiments with modifications and variations are possible. Although the disclosure has been described in language specific to structural features and/or methodological acts, it is to be understood that the embodiments are not necessarily limited to the specific features or acts described. Rather, the specific features and acts are disclosed as exemplary forms of implementing the embodiments.

What is claimed is:

1. An apparatus, comprising:
    a first input;
    a second input;
    a time-to-digital converter, said time-to-digital converter comprising a first time-to-digital converter input, a second time-to-digital converter input, a first oscillator, and a second oscillator;
    a first multiplexer, a first input of said first multiplexer being coupled with said first input, a second input of said first multiplexer being coupled with an output of said first oscillator, and an output of said first multiplexer being coupled with said first time-to-digital converter input; and
    a second multiplexer, a first input of said second multiplexer being coupled with said second input, a second input of said second multiplexer being coupled with an output of said second oscillator, and an output of said second multiplexer being coupled with said second time-to-digital converter input.

2. The apparatus of claim 1, wherein said first oscillator and said second oscillator are free running oscillators.

3. The apparatus of claim 1, wherein said first oscillator is configured to output a signal with a first frequency and said second oscillator is configured to output a signal with a second frequency different from said first frequency.

4. The apparatus of claim 3, wherein said second frequency differs from said first frequency by at most 20%.

5. The apparatus of claim 1, further comprising an evaluation logic portion coupled to an output of said time-to-digital converter.

6. The apparatus of claim 5, wherein said evaluation logic portion is configured to evaluate a histogram of output values of said time-to-digital converter.

7. The apparatus of claim 1, wherein at least one oscillator from the group consisting of said first oscillator and said second oscillator is a frequency variable oscillator.

8. The apparatus of claim 1, further comprising a control, said control being coupled to at least one element from the group consisting of said first oscillator, said second oscillator, said first multiplexer, and said second multiplexer.

9. The time-to-digital converter of claim 1, further comprising an alignment detector coupled to an output of said first oscillator and an output of said second oscillator, and being configured to detect a predetermined phase difference between signals output by said first and second oscillators.

10. An apparatus, comprising:
    a time-to-digital converter;
    a first oscillator configured to generate a first signal with a first frequency;
    a second oscillator configured to generate a second signal with a second frequency;
    at least one multiplexer configured to selectively couple said first signal to a start input of said time-to-digital converter and said second signal to a stop input of said time-to-digital converter; and
    an evaluation logic portion coupled to an output of said time-to-digital converter, and being configured to perform a test of the time-to-digital converter based on output signals responsive to the first and second signal being fed to said time-to-digital converter.

11. The apparatus of claim 10, wherein said first oscillator and said second oscillator are free running oscillators.

12. The apparatus of claim 10, wherein said evaluation logic is configured to evaluate a histogram of output values of said time-to-digital converters.

13. The apparatus of claim 12, wherein said evaluation logic portion is configured to detect in said histogram at least one event selected from the group consisting of a value occurring more often than average, a value occurring less often than average, and a missing value.

14. The apparatus of claim 10, wherein said evaluation logic is configured to check whether each expected value occurs at said output of said time-to-digital converter.

15. The apparatus of claim 10, wherein said evaluation logic portion is configured to monitor the occurrence of at least one predetermined value at said output of said time-to-digital converter.

16. The apparatus of claim 10, wherein said evaluation logic is configured to measure an output value of said time-to-digital converter a predetermined number of periods of said first and second signal after said first and second signals are aligned.

17. The apparatus of claim 10, wherein said evaluation logic portion is configured to measure a plurality of output values at a predetermined time from an alignment of said first signal and said second signal.

18. The apparatus of claim 10, further comprising selection circuitry coupled between said first and second oscillators and said time-to-digital converter, and being configured to forward only every Lth event of said first signal, triggering a start of a time period measured by said time-to-digital converter, and only every Lth event of said second signal, triggering a stop of said time period measured to said time-to-digital converter, L being an integer number.

19. An apparatus comprising:
 a time-to-digital converter;
 a first free running oscillator coupled to a start input of said time-to-digital converter; and
 a second free running oscillator coupled to a stop input of said time-to-digital converter.

20. The apparatus of claim 19,
 wherein said first free running oscillator is coupled with said start input via a first multiplexer, and wherein said second free running oscillator is coupled with said stop input via a second multiplexer.

21. The apparatus of claim 19, further comprising a state machine configured to control said first oscillator and said second oscillator.

22. A method, comprising:
 generating a first oscillation with a first frequency;
 generating a second oscillation with a second frequency different from said first frequency;
 coupling said first oscillation and said second oscillation to a time-to-digital converter; and
 evaluating a distribution of output values output by said time-to-digital converter.

23. The method of claim 22, wherein said coupling comprises controlling multiplexers.

24. The method of claim 22, wherein said evaluating comprises evaluating a histogram for at least one of missing values, values that occur more often than average, and values that occur less often than average.

25. The method of claim 22, further comprising varying a frequency of at least one oscillation of the group consisting of said first oscillation and said second oscillation.

* * * * *